United States Patent
Iyengar et al.

(10) Patent No.: US 9,043,180 B2
(45) Date of Patent: May 26, 2015

(54) REDUCING POWER CONSUMPTION DURING MANUFACTURING TEST OF AN INTEGRATED CIRCUIT

(75) Inventors: Vikram Iyengar, Pittsburgh, PA (US); Animesh Khare, Bangalore (IN); Kenneth Pichamuthu, Bellandur (IN)

(73) Assignee: International Business Machines Corporation, Armonk, NY (US)

( * ) Notice: Subject to any disclaimer, the term of this patent is extended or adjusted under 35 U.S.C. 154(b) by 690 days.

(21) Appl. No.: 13/369,642

(22) Filed: Feb. 9, 2012

(65) Prior Publication Data
US 2013/0211769 A1    Aug. 15, 2013

(51) Int. Cl.
*G01N 33/48*    (2006.01)
*G01R 31/3185*    (2006.01)

(52) U.S. Cl.
CPC .............................. *G01R 31/318575* (2013.01)

(58) Field of Classification Search
None
See application file for complete search history.

(56) References Cited

U.S. PATENT DOCUMENTS

| | | | |
|---|---|---|---|
| 5,592,493 A | 1/1997 | Crouch et al. | |
| 6,954,887 B2 * | 10/2005 | Wang et al. | 714/729 |
| 6,957,403 B2 | 10/2005 | Wang et al. | |
| 7,124,342 B2 | 10/2006 | Wang et al. | |
| 7,331,032 B2 | 2/2008 | Wang et al. | |
| 7,647,540 B2 | 1/2010 | Rajski et al. | |
| 7,693,676 B1 | 4/2010 | Keller et al. | |
| 7,904,857 B2 | 3/2011 | Wang et al. | |
| 2003/0097614 A1 * | 5/2003 | Rajski et al. | 714/30 |
| 2008/0282122 A1 | 11/2008 | Guettaf | |

FOREIGN PATENT DOCUMENTS

EP    0510389 A1    10/1992
JP    2007109720 A    4/2007

* cited by examiner

*Primary Examiner* — Aditya Bhat
(74) *Attorney, Agent, or Firm* — Michael LeStrange; Hoffman Warnick LLC (57) ABSTRACT

Aspects of the invention provide for reducing power consumption during manufacturing testing of an IC. In one embodiment, aspects of the invention include a method for reducing power consumption during a manufacturing test of an integrated circuit (IC), the method including: providing a plurality of domains, each domain associated with a clock phase; grouping, based on each domain, a first plurality of scan chains into a first test group; grouping, based on each domain, a second plurality of scan chains into a second test group, wherein the grouping of the first test group and of the second test group includes determining which domains can be tested simultaneously; and performing the manufacturing test of the IC.

16 Claims, 6 Drawing Sheets

FIG. 1 PRIOR ART

| Domain | Clock phase | Test group |
|---|---|---|
| Core | Clk125 | 1 |
| Core_2x | Clk250 | 1 |
| cpu | clk333 | 2 |
| Cpu_2x | clk666 | 2 |
| random | clk312 | 1 |

REDUCING POWER CONSUMPTION DURING MANUFACTURING TEST OF AN INTEGRATED CIRCUIT

BACKGROUND OF THE INVENTION

The subject matter disclosed herein relates generally to integrated circuits. More specifically, the disclosure provided herein relates to methods for reducing power consumption during a manufacturing test of an integrated circuit.

Power consumption of an integrated circuit during manufacturing test may be significantly higher than power consumption during functional operation. This is because functional modules of the chip that ordinarily do not work together during operation may be tested simultaneously. Moreover, a large number of flip-flops switch during a scan operation of a manufacturing test, when random values are moved through scan chains. Power consumption during scans has been shown to be several times higher during the test response capture cycle. A common solution to reduce power during the scans is to scan values into the chip at a slower rate. However, the slow rate of scanning will increase the time required to complete the test.

During an at-speed structural test (ASST), only one functional clock domain is tested at a time to prevent unpredictable asynchronous captures across clock domain boundaries. Even though only a fraction of the test pattern bits are used to test a single clock domain in a test pattern, data is scanned into all the flip-flops in the circuit. This represents a significant amount of power consumption during the test. To prevent yield loss because of higher power consumption during ASST, scanning has to be done at slower speeds. The time of ASST increases because of the cumulative effect of separate sets of slower scan operations needed for testing each functional clock domain.

BRIEF DESCRIPTION OF THE INVENTION

Aspects of the invention provide for reducing power consumption during manufacturing testing of an IC. In one embodiment, aspects of the invention include a method for reducing power consumption during a manufacturing test of an integrated circuit (IC), the method including: providing a plurality of domains, each domain associated with a clock phase; grouping, based on each domain, a first plurality of scan chains into a first test group; grouping, based on each domain, a second plurality of scan chains into a second test group, wherein the grouping of the first test group and of the second test group includes determining which domains can be tested simultaneously; and performing the manufacturing test of the IC.

A first aspect of the invention provides a method for reducing power consumption during a manufacturing test of an integrated circuit (IC), the method comprising: providing a clock domain spreadsheet including a plurality of domains, each domain associated with a clock phase; grouping, based on each domain, a first plurality of scan chains into a first test group; grouping, based on each domain, a second plurality of scan chains into a second test group, wherein the grouping of the first test group and of the second test group includes determining which domains can be tested simultaneously; and performing the manufacturing test of the IC.

A second aspect of the invention provides a non-transitory computer-readable medium, which when executed, enables a computer system to implement a method for reducing power consumption during a manufacturing test of an integrated circuit (IC), the method comprising: providing a clock domain spreadsheet including a plurality of domains, each domain associated with a clock phase; grouping, based on each domain, a first plurality of scan chains into a first test group; grouping, based on each domain, a second plurality of scan chains into a second test group, wherein the grouping of the first test group and of the second test group includes determining which domains can be tested simultaneously; and performing the manufacturing test of the IC.

A third aspect of the invention provides a computer system, comprising: at least one computing device configured to reduce power consumption during a manufacturing test of an integrated circuit (IC) by: providing a clock domain spreadsheet including a plurality of domains, each domain associated with a clock phase; grouping, based on each domain, a first plurality of scan chains into a first test group; grouping, based on each domain, a second plurality of scan chains into a second test group, wherein the grouping of the first test group and of the second test group includes determining which domains can be tested simultaneously; and performing the manufacturing test of the IC.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

The subject matter disclosed herein relates generally to integrated circuits. More specifically, the disclosure provided herein relates to methods for reducing power consumption during a manufacturing test of an integrated circuit.

Power consumption of an integrated circuit during manufacturing test may be significantly higher than power consumption during functional operation. This is because functional modules of the chip that ordinarily do not work together during operation may be tested simultaneously. Moreover, a large number of flip-flops switch during a scan operation of a manufacturing test, when random values are moved through scan chains. Power consumption during scans has been shown to be several times higher during the test response capture cycle. A common solution to reduce power during the scans is to scan values into the chip at a slower rate. However, the slow rate of scanning will increase the time required to complete the test.

During an at-speed structural test (ASST), only one functional clock domain is tested at a time to prevent unpredictable asynchronous captures across clock domain boundaries. Even though only a fraction of the test pattern bits are used to test a single clock domain in a test pattern, data is scanned into all the flip-flops in the circuit. This represents a significant amount of power consumption during the test. To prevent yield loss because of higher power consumption during ASST, scanning has to be done at slower speeds. The test time of ASST increases because of the cumulative effect of separate sets of slower scan operations needed for testing each functional clock domain.

Aspects of the invention provide for reducing power consumption during a manufacturing test of an IC. In one embodiment, aspects of the invention include a method for reducing power consumption during a manufacturing test of an integrated circuit (IC), the method comprising: providing a clock domain spreadsheet including a plurality of domains, each domain associated with a clock phase; grouping, based on each domain, a plurality of scan chains into a first test group; grouping, based on each domain, the plurality of scan chains into a second test group; and performing the manufacturing test of the IC.

The methods provided in this disclosure reduce scan power consumption during ASSTs by ensuring that only tested domains are scanned. Lower power consumption during at-speed testing allows the scan operations during at-speed mode to be sped up to the extent where the power consumption matches the power consumption of full scan mode (the maximum power that the IC is subjected to).

Figure 1:
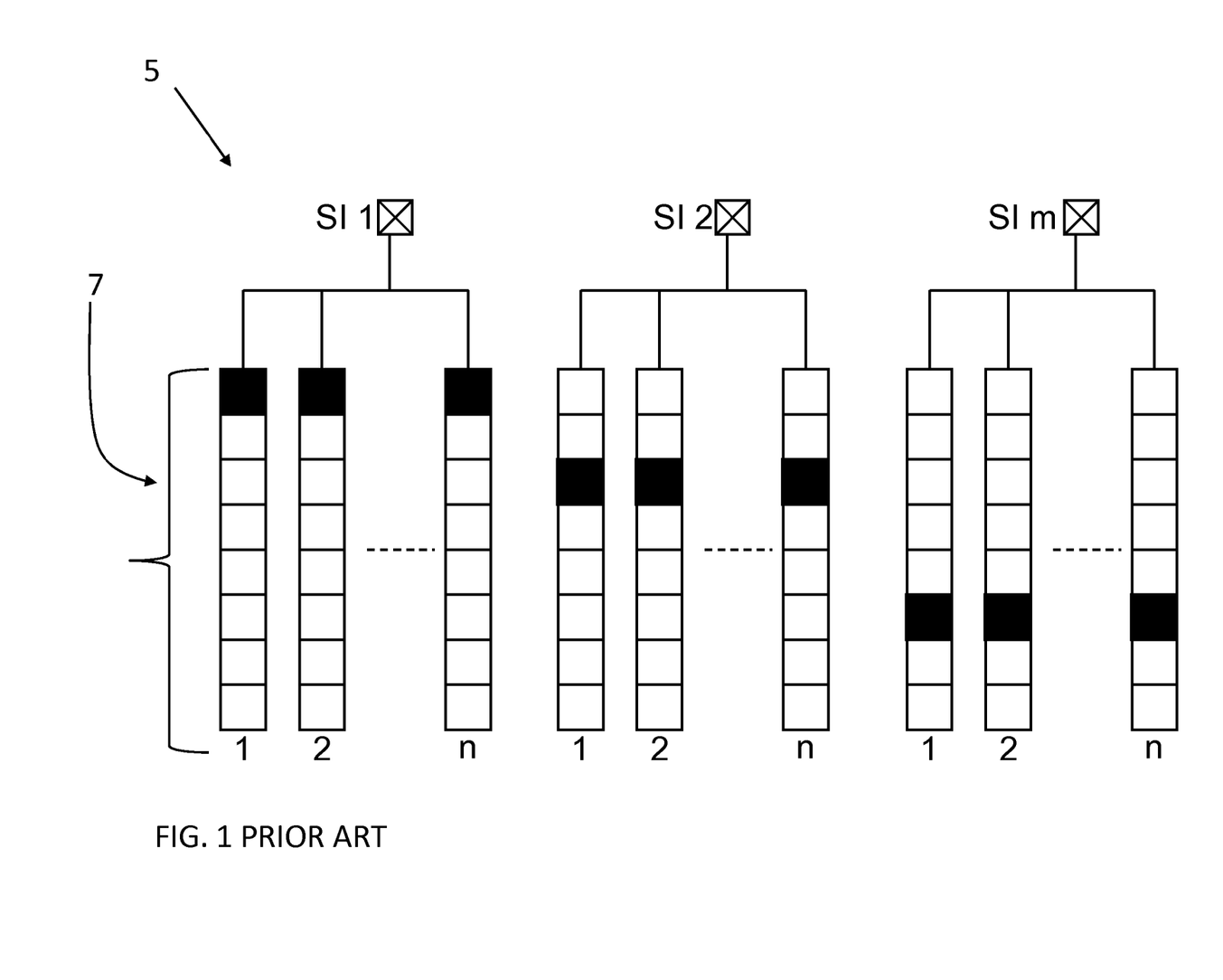
FIG. 1 shows an illustrative diagram of a prior art broadcast scan according to embodiments of the invention.

Turning now to FIG. 1, an illustrative diagram of a prior art broadcast scan 5 is shown. In this style of test compression, each scan-in (SI 1, SI 2, ..., SI m) fans out into "n" scan chains 7. The same data is scanned into all "n" scan chains 7 at the same level for a given scan-in pin (SI 1, SI 2, ..., SI m). Conventionally, the primary concern of the scan chains 7 has been chain balancing. However, in balancing scan chains 7, the power consumption during a manufacturing test is extremely high.

Figure 2:
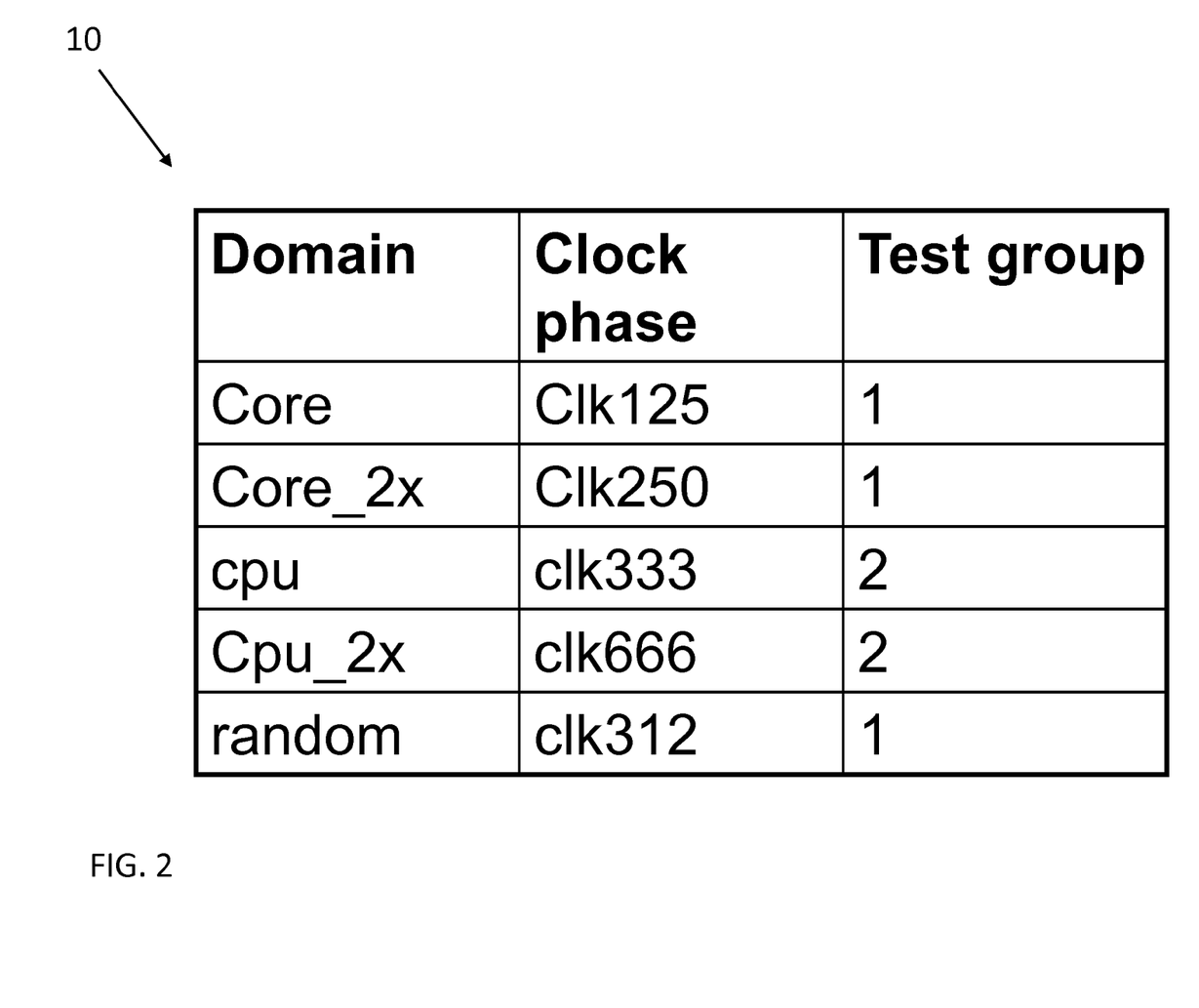
FIG. 2 shows a plurality of clock domains according to embodiments of the invention.

Turning now to FIGS. 2-5, methods of reducing power consumption during a manufacturing test of an IC will now be discussed. According to embodiments of the invention, methods of reducing power consumption during a manufacturing test of an IC provides a clock domain spreadsheet 10 including a plurality of domains, wherein each domain is associated with a clock phase, and a test group. For example, as seen in FIG. 2, the clock domain spreadsheet 10 includes Core, Core__2x, cpu, Cpu__2x, and random for the domains. Each of these domains includes a different clock phase ("Clk125;" "Clk250;" "Clk333;" "Clk666;" "Clk312").

The method for reducing power consumption during a manufacturing test of an IC further includes grouping, based on the domains, a first test group including a plurality of scan chains, and a second test group including a plurality of scan chains. The plurality of scan chains in the first test group may include a single clock domain. Further, the plurality of scan chains in the second test group may also include a single clock domain. Alternatively, the first test group may include several domains that do not interfere with one other; therefore, these domains may be tested in the same scan chain. For example, in the spreadsheet 10 shown in FIG. 2, clock phase Clk 125, Core__2x, and Clk 312 may all be tested in the same scan chain.

It is understood that the example of the clock domain spreadsheet 10 is not limiting in any way to the embodiments of the invention, and that other embodiments of the invention may include different domains and/or more domains.

Figure 3:
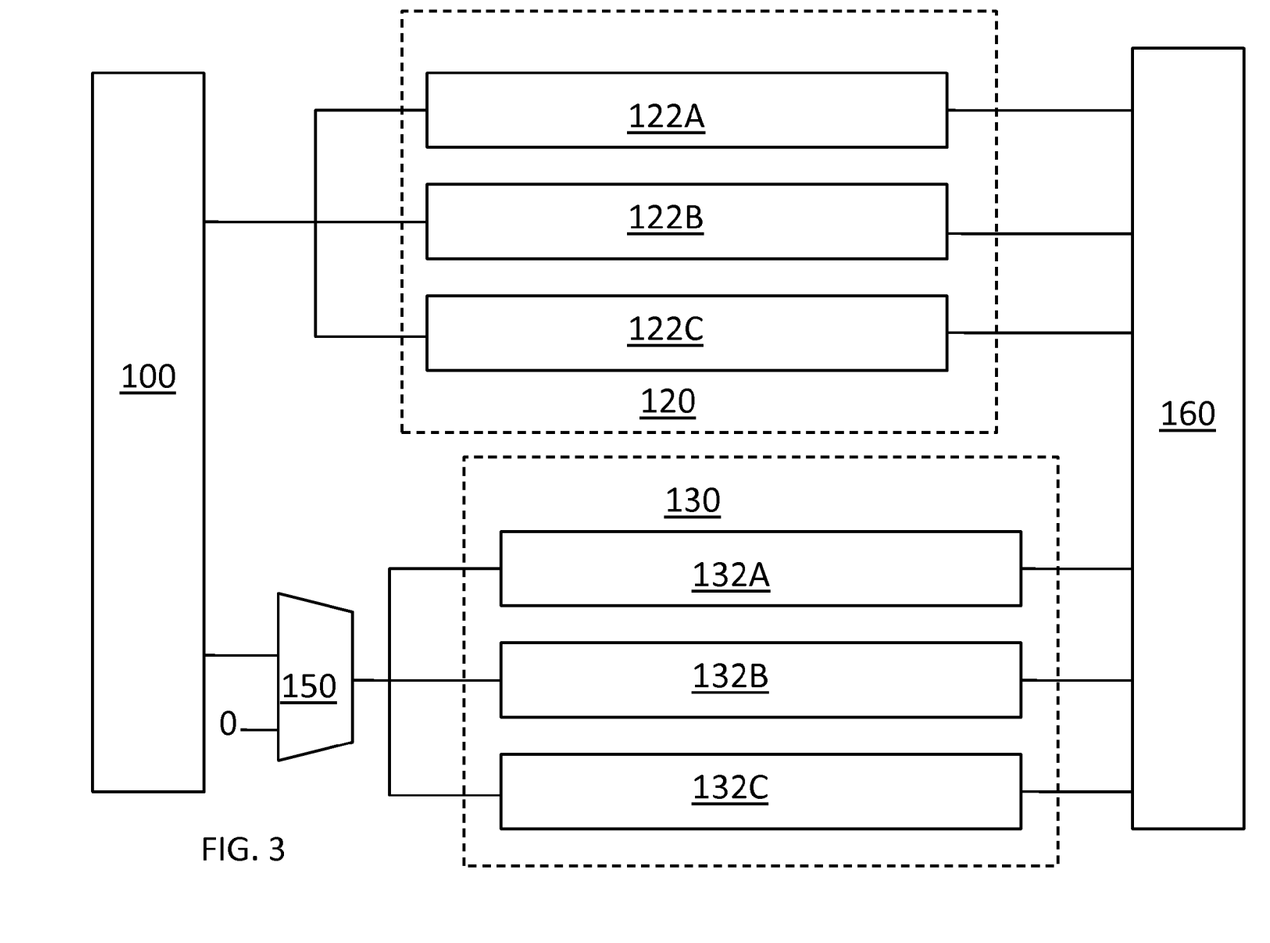
FIG. 3 shows a circuit diagram according to embodiments of the invention.

Turning now to FIG. 3, a circuit diagram of a scan insertion system according to embodiments of the invention is shown. In the embodiment shown in FIG. 3, a manufacturing test of the IC may be performed by scanning in values into a first test group 120 that includes a plurality of scan chains 122A, 122B, 122C. Although only three scan chains are shown in each test group 120, 130, it is understood that multiple scan chains may be in each test group 120, 130. Further, although only two test groups 120, 130 are shown, it is understood that multiple test groups may be in the scan insertion system.

Figure 4:
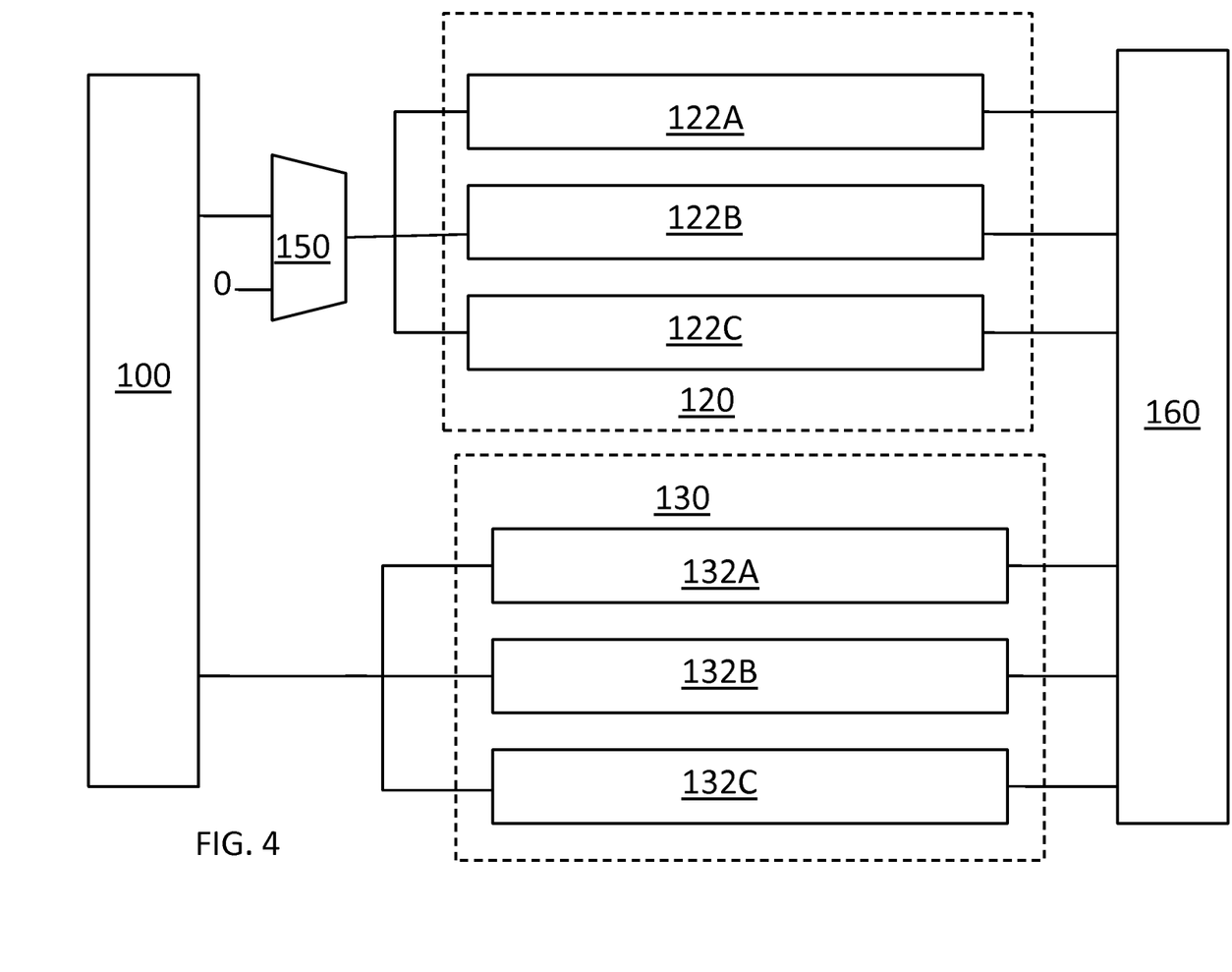
FIG. 4 shows a circuit diagram according to embodiments of the invention.

While values are scanned into the scan chains 122A, 122B, 122C of the first test group 120 (from scan I/O device 100), zeroes may be scanned into the scan chains 132A, 132B, 132C of the second test group 130 to shut down the scan chains 132A, 132B, 132C. Alternatively, as shown in FIG. 3, a multiplexer 150 may be provided to shut down the power to the second test group 130. Next, as shown in FIG. 4, values are scanned into scan chains 132A, 132B, 132C of the second test group 130, while zeroes may be scanned into scan chains 122A, 122B, 122C of the first test group 120 to shut down the scan chains 122A, 122B, 122C. Alternatively, as shown in FIG. 4, a multiplexer 150 may be provided to shut down the power to the first test group 120. Using this scan insertion system of FIGS. 3-4, the manufacturing test uses a reduced amount of power consumption during scan operations, which allows scan operations to be sped up. This ultimately will reduce the total scan time. Further, the test memory (not shown) is significantly unused on scan I/O devices, such as scan I/O devices 100.

Figure 5:
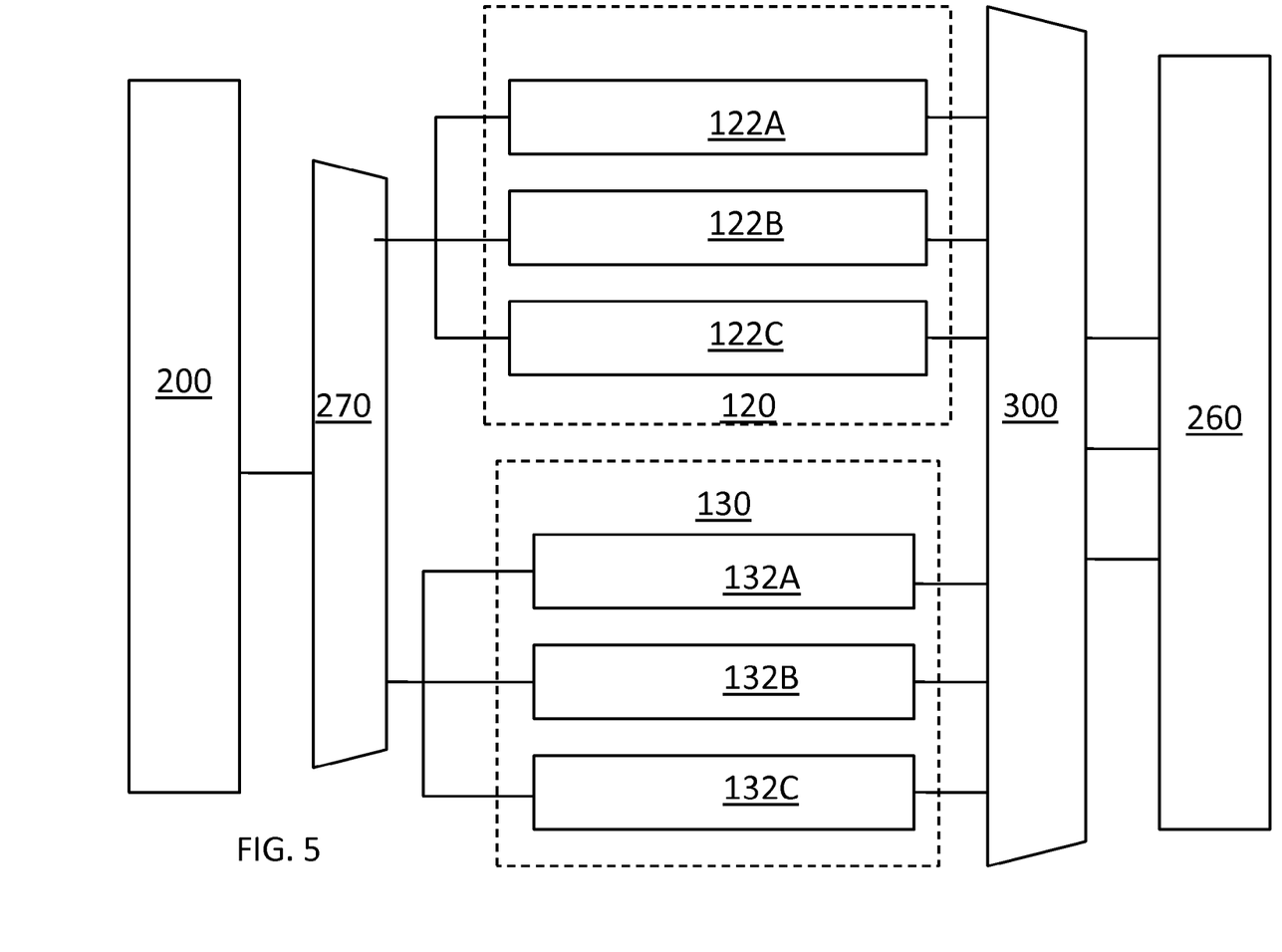
FIG. 5 shows a circuit diagram according to embodiments of the invention.

Turning now to FIG. 5, a scan insertion system according to another embodiment of the invention is shown. In this embodiment, a first set of scanning values and a second set of scanning values are simultaneously set (by scan I/O device 200). A demultiplexer 270 chooses which test group 120, 130 receives the scanning values first. A multiplexer 300 chooses the appropriate output to send on. This reduces power consumption during manufacturing tests because only a subset of the test groups receive the scanning values at a time.

Figure 6:
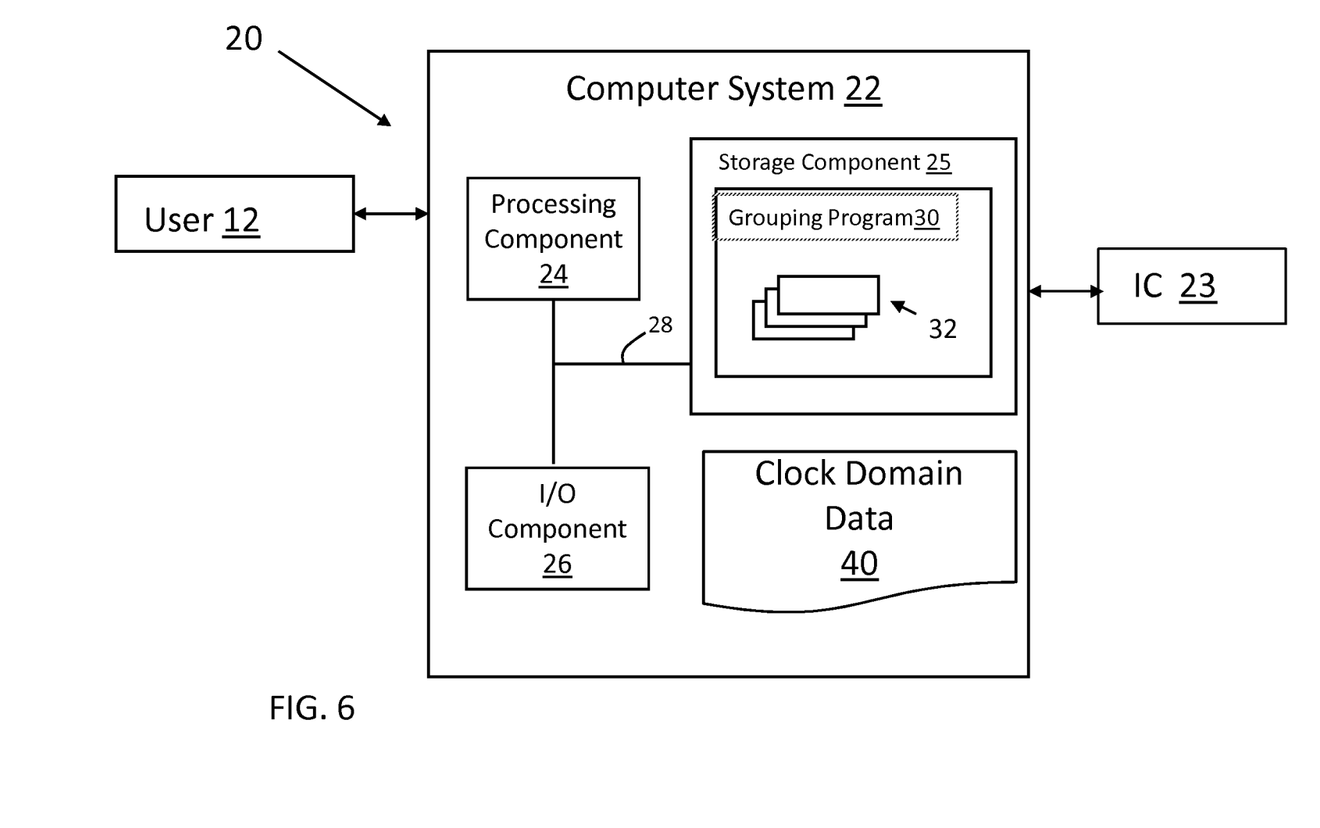
FIG. 6 shows an illustrative environment according to embodiments of the invention.

Turning now to FIG. 6, an illustrative environment 20 for reducing power consumption during manufacturing testing of an IC 23 according to embodiments of the invention is shown. To this extent, environment 20 includes a computer system 22 that can perform a process described herein in order to reduce power consumption during manufacturing testing of an IC 23. In particular, computer system 22 is shown including a grouping program 30, which makes computer system 22 operable to reduce power consumption during manufacturing testing of IC 23 by performing the process described above with respect to FIGS. 2-5.

Computer system 22 is shown including a processing component 24 (e.g., one or more processors), a storage component 25 (e.g., a storage hierarchy), an input/output (I/O) component 26 (e.g., one or more I/O interfaces and/or devices), and a communications pathway 28. In general, processing component 24 executes program code, such as grouping program 30, which is at least partially fixed in storage component 25. While executing program code, processing component 24 can process data, which can result in reading and/or writing transformed data from/to storage component 25 and/or I/O component 26 for further processing. Pathway 28 provides a communications link between each of the components in computer system 22. I/O component 26 can comprise one or more human I/O devices, which enable a human user 12 to interact with computer system 22 and/or one or more communications devices to enable a system user 12 to communicate with computer system 22 using any type of communications link. To this extent, grouping program 30 can manage a set of interfaces (e.g., graphical user interface(s), application program interface, and/or the like) that enable human and/or system users 12 to interact with grouping program 30. Further, grouping program 30 can manage (e.g., store, retrieve, create, manipulate, organize, present, etc.) the data, such as clock domain data 40 (i.e., clock domain spreadsheet 10 (FIG. 2)), using any solution.

In any event, computer system 22 can comprise one or more general purpose computing articles of manufacture (e.g., computing devices) capable of executing program code, such as grouping program 30, installed thereon. As used herein, it is understood that "program code" means any collection of instructions, in any language, code or notation, that cause a computing device having an information processing capability to perform a particular action either directly or after any combination of the following: (a) conversion to another language, code or notation; (b) reproduction in a different material form; and/or (c) decompression. To this extent, distribution program 30 can be embodied as any combination of system software and/or application software.

Further, grouping program 30 can be implemented using a set of modules 32. In this case, a module 32 can enable computer system 22 to perform a set of tasks used by grouping program 30, and can be separately developed and/or implemented apart from other portions of grouping program 30. As used herein, the term "component" means any configuration of hardware, with or without software, which implements the functionality described in conjunction therewith using any solution, while the term "module" means program code that enables a computer system 22 to implement the actions described in conjunction therewith using any solution. When fixed in a storage component 25 of a computer system 22 that includes a processing component 24, a module is a substantial portion of a component that implements the actions. Regardless, it is understood that two or more components, modules, and/or systems may share some/all of their respective hardware and/or software. Further, it is understood that some of the functionality discussed herein may not be implemented or additional functionality may be included as part of computer system 22.

When computer system 22 comprises multiple computing devices, each computing device can have only a portion of grouping program 30 fixed thereon (e.g., one or more modules 32). However, it is understood that computer system 22 and grouping program 30 are only representative of various possible equivalent computer systems that may perform a process described herein. To this extent, in other embodiments, the functionality provided by computer system 22 and grouping program 30 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 22 includes multiple computing devices, the computing devices can communicate over any type of communications link. Further, while performing a process described herein, computer system 22 can communicate with one or more other computer systems using any type of communications link. In either case, the communications link can comprise any combination of various types of optical fiber, wired, and/or wireless links; comprise any combination of one or more types of networks; and/or utilize any combination of various types of transmission techniques and protocols.

As discussed herein, grouping program 30 enables computer system 22 to reduce power consumption during manufacturing testing of IC 23. To this extent, computer system 22 may perform the method according to aspects of the invention, as discussed herein with respect to FIGS. 2-5.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements within substantial differences from the literal languages of the claims.

What is claimed is:

1. A method for reducing power consumption during a manufacturing test of an integrated circuit (IC), the method comprising:
   providing a plurality of domains, each domain associated with a clock phase;
   grouping, based on each domain, a first plurality of scan chains into a first test group;
   grouping, based on each domain, a second plurality of scan chains into a second test group, wherein the grouping of the first test group and the grouping of the second test group includes determining which domains can be tested simultaneously; and
   performing the manufacturing test of the IC, wherein the performing the manufacturing test of the IC includes:
   selecting one of the first test group or the second test group;
   allowing simultaneous testing of the selected test group; and
   preventing simultaneous testing of the non-selected test group with the selected test group.

2. The method of claim 1, wherein the allowing simultaneous testing of the selected test group includes scanning values into the selected test group; and wherein the preventing simultaneous testing of the non-selected test group with the selected test group includes scanning zeroes into the non-selected test group.

3. The method of claim 1, wherein the allowing simultaneous testing of the selected test group includes scanning values into the selected test group; and wherein the preventing simultaneous testing of the non-selected test group with the selected test group includes shutting off scans to the non-selected test group using a multiplexer.

4. The method of claim 1, wherein performing the manufacturing test of the IC includes:
   providing, simultaneously, a first set of scanning values and a second set of scanning values;
   passing, using a demultiplexer, one of: the first set of scanning values or the second set of scanning values, to one of: the first test group or the second test group; and simultaneously testing, based on which set of scanning values are passed by the demultiplexer, one of: the first test group or the second test group.

5. The method of claim 4, further comprising passing, using a multiplexer, one of: an output of the first test group or an output of the second test group, based on which set of scanning values are passed by the demultiplexer.

6. A non-transitory computer-readable medium, which when executed, enables a computer system to implement a method for reducing power consumption during a manufacturing test of an integrated circuit (IC), the method comprising:
   providing a plurality of domains, each domain associated with a clock phase;
   grouping, based on each domain, a first plurality of scan chains into a first test group;
   grouping, based on each domain, a second plurality of scan chains into a second test group, wherein the grouping of the first test group and the grouping of the second test group includes determining which domains can be tested simultaneously; and
   performing the manufacturing test of the IC, wherein the performing the manufacturing test of the IC includes:
      selecting one of the first test group or the second test group;
      allowing simultaneous testing of the selected test group; and
      preventing simultaneous testing of the non-selected test group with the selected test group.

7. The computer-readable medium of claim 6, wherein the allowing simultaneous testing of the selected test group includes scanning values into the selected test group; and wherein the preventing simultaneous testing of the non-selected test group with the selected test group includes scanning zeroes into the second non-selected test group.

8. The computer-readable medium of claim 6, wherein the allowing simultaneous testing of the selected test group includes scanning values into the selected test group; and wherein the preventing simultaneous testing of the non-selected test group with the selected test group includes shutting off scans to the non-selected test group using a multiplexer.

9. The computer-readable medium of claim 6, wherein performing the manufacturing test of the IC includes:
   providing, simultaneously, a first set of scanning values and a second set of scanning values;
   passing, using a demultiplexer, one of: the first set of scanning values or the second set of scanning values, to one of: the first test group or the second test group; and
   simultaneously testing, based on which set of scanning values are passed by the demultiplexer, one of: the first test group or the second test group.

10. The computer-readable medium of claim 9, further comprising passing, using a multiplexer, one of: an output of the first test group or an output of the second test group, based on which set of scanning values are passed by the demultiplexer.

11. A computer system, comprising:
   at least one computing device configured to reduce power consumption during a manufacturing test of an integrated circuit (IC) by:
      providing a plurality of domains, each domain associated with a clock phase;
      grouping, based on each domain, a first plurality of scan chains into a first test group;
      grouping, based on each domain, a second plurality of scan chains into a second test group, wherein the grouping of the first test group and the grouping of the second test group includes determining which domains can be tested simultaneously; and
      performing the manufacturing test of the IC, wherein the performing the manufacturing test of the IC includes:
         selecting one of the first test group or the second test group;
         allowing simultaneous testing of the selected test group; and
         preventing simultaneous testing of the non-selected test group with the selected test group.

12. The computer system of claim 11, wherein the allowing simultaneous testing of the selected test group includes scanning values into the selected test group; and wherein the preventing simultaneous testing of the non-selected test group with the selected test group includes scanning zeroes into the non-selected test group.

13. The computer system of claim 11,
   wherein the allowing simultaneous testing of the selected test group includes scanning values into the selected test group; and
   wherein the preventing simultaneous testing of the non-selected test group with the selected test group includes scanning zeroes into the non-selected test group.

14. The computer system of claim 11, wherein performing the manufacturing test of the IC includes:
   providing, simultaneously, a first set of scanning values and a second set of scanning values;
   passing, using a demultiplexer, one of: the first set of scanning values or the second set of scanning values, to one of: the first test group or the second test group; and
   simultaneously testing, based on which set of scanning values are passed by the demultiplexer, one of: the first test group or the second test group.

15. The computer system of claim 14, further comprising passing, using a multiplexer, one of: an output of the first test group or an output of the second test group, based on which set of scanning values are passed by the demultiplexer.

16. The computer system of claim 11, wherein the allowing simultaneous testing of the selected test group includes scanning values into the selected test group; and wherein the preventing simultaneous testing of the non-selected test group with the selected test group includes shutting off scans to the non-selected test group using a multiplexer.

\* \* \* \* \*